United States Patent [19]
Duffy et al.

[11] Patent Number: 6,084,479
[45] Date of Patent: Jul. 4, 2000

[54] CIRCUIT, ARCHITECTURE AND METHOD (S) OF CONTROLLING A PERIODIC SIGNAL GENERATING CIRCUIT OR DEVICE

[75] Inventors: Michael L. Duffy, Austin, Tex.; Paul H. Scott, San Jose, Calif.

[73] Assignee: Cypress Semiconductor Corp., San Jose, Calif.

[21] Appl. No.: 09/086,124

[22] Filed: May 28, 1998

[51] Int. Cl.⁷ ........................................... H03L 7/00
[52] U.S. Cl. .................. 331/17; 331/DIG. 2; 331/2; 331/1 A; 331/16; 455/260; 375/376
[58] Field of Search ................ 331/17, 1 A, 2, 331/16, DIG. 2; 327/159, 160; 375/376; 455/260

[56] References Cited

U.S. PATENT DOCUMENTS

| | | | |
|---|---|---|---|
| 4,668,922 | 5/1987 | Crawford et al. | 331/1 A |
| 4,812,783 | 3/1989 | Honjo et al. | 331/20 |
| 4,817,199 | 3/1989 | Wallraff | 455/260 |
| 4,949,051 | 8/1990 | Viola | 331/11 |
| 4,972,442 | 11/1990 | Steierman | 375/357 |
| 4,980,899 | 12/1990 | Troost et al. | 375/357 |
| 5,059,925 | 10/1991 | Weisbloom | 331/1 A |
| 5,233,314 | 8/1993 | McDermott et al. | 331/17 |
| 5,329,252 | 7/1994 | Major | 331/15 |
| 5,444,744 | 8/1995 | Yamamoto et al. | 375/376 |
| 5,457,428 | 10/1995 | Alder et al. | 331/1 A |
| 5,550,515 | 8/1996 | Liang et al. | 331/11 |
| 5,724,007 | 3/1998 | Mar | 331/1 A |
| 5,815,042 | 9/1998 | Chow et al. | 331/57 |

*Primary Examiner*—Arnold Kinkead
*Attorney, Agent, or Firm*—Christopher P. Maiorana, P.C.

[57] ABSTRACT

An apparatus comprising a phase-locked loop, a select circuit and a control circuit. The phase-locked loop may be configured to generate a feedback signal (along with a buffered output signal) in response to a reference clock and a control signal. A select circuit may be configured to present a reference clock signal in response to a plurality of input clock signals and a select signal. The slew control circuit may be configured to generate the control signal in response to the select signal, and the feedback signal. The control circuit may be used to reduce noise presented to the phase-locked loop and may allow for a rapid initial frequency acquisition of the PLL to the reference frequency.

19 Claims, 7 Drawing Sheets

6,084,479

CIRCUIT, ARCHITECTURE AND METHOD(S) OF CONTROLLING A PERIODIC SIGNAL GENERATING CIRCUIT OR DEVICE

FIELD OF THE INVENTION

The present invention relates to phase-locked loops generally and, more particularly, to a phase-locked loop with selectable reference clocks that allows for slew rate smoothing of phase differences between the reference clocks.

BACKGROUND OF THE INVENTION

Referring to FIG. 1, a block diagram of a circuit 10 illustrating a conventional approach to providing a 2-input phase-locked loop is shown. The circuit 10 generally comprises a phase frequency detector (PFD) 12, a charge pump 14, a voltage controlled oscillator (VCO) 16, a loop filter 18, a feedback counter 20, and an input multiplexer 22. The phase frequency detector 12, the charge pump 14 and the VCO 16 provide the basic components of a standard phase-locked loop. An output 24 presents a signal VCOCLK to an input 26 of the feedback counter 20. The feedback counter 20 has an output 28 that presents a signal REFOUT that may also be presented to an input 30 of the PFD 12 as a feedback signal FBCLK. The input multiplexer 22 has an input 32 that receives a first reference clock REFCLK0 and a second input 34 that receives a second clock REFCLK1. An input 36 receives a select signal REFSEL that presents a signal REFCLK at an output 38 by selecting between the clocks received at the inputs 32 and 34. The signal REFCLK is presented to an input 40 of the PFD 12. While the circuit 10 may provide switching between the input clocks REFCLK0 and REFCLK1 without glitching REFOUT, a data stream that is clocked with the signal VCOCLK (e.g., a SONET data stream) may not be recovered properly due to the lack of slew rate limitation of the circuit 10. To properly recover a high-rate data stream clocked with the signal VCOCLK, the overall slew rate of the circuit 10 needs to be reduced.

Referring to FIG. 2, an example of a circuit 50 illustrating a slew rate window generator is shown. The circuit 50 generally comprises a delay block 52 and a gate 54. The delay block 52 has an input 56 that receives a reference clock signal REFCLK and an output 58 that presents a delayed clock signal REF_DEL that may be presented to an input 60 of the gate 54. The signal REFCLK may also be presented to an input 62 of the gate 54. The gate 54 presents a signal SLEW_WIN that may be derived from the signal REFCLK. The addition of a delay block 52 may take significant die area to implement. Furthermore, the amount of delay presented by the delay block 52 is sensitive to process and temperature variations. Since the circuit 50 is always in an active state, the overall noise introduced into the circuit 10 will be increased.

SUMMARY OF THE INVENTION

The present invention concerns an apparatus comprising a phase-locked loop, a select circuit and a control circuit. The phase-locked loop may be configured to generate a feedback signal (along with a buffered output signal) in response to a reference clock and a control signal. A select circuit may be configured to present a reference clock signal in response to a plurality of input clock signals and a select signal. The slew control circuit may be configured to generate the control signal in response to the select signal, and the feedback signal. The control circuit may be used to reduce noise presented to the phase-locked loop and may allow for a rapid initial frequency acquisition of the PLL to the reference frequency.

The objects, features and advantages include providing a phase-locked- loop circuit that may (i) have a rapid initial frequency acquisition, (ii) provide slew control for a predetermined time after a change in the reference clock, (iii) provide optional external filtering to further reduce the slew rate, (iv) suppress noise to avoid the inadvertent assertion of the slew reduction circuitry, (v) operate relatively constant over process, temperature and voltage variations, and (vi) require a minimal amount of die area to implement.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention concerns a phase-locked loop including a control circuit that may be used to provide slew rate control of a buffered output signal. The control circuit may allow for a rapid initial frequency acquisition of the PLL to the selected reference input. An external loop filter may provide additional slew rate minimization.

Figure 1:
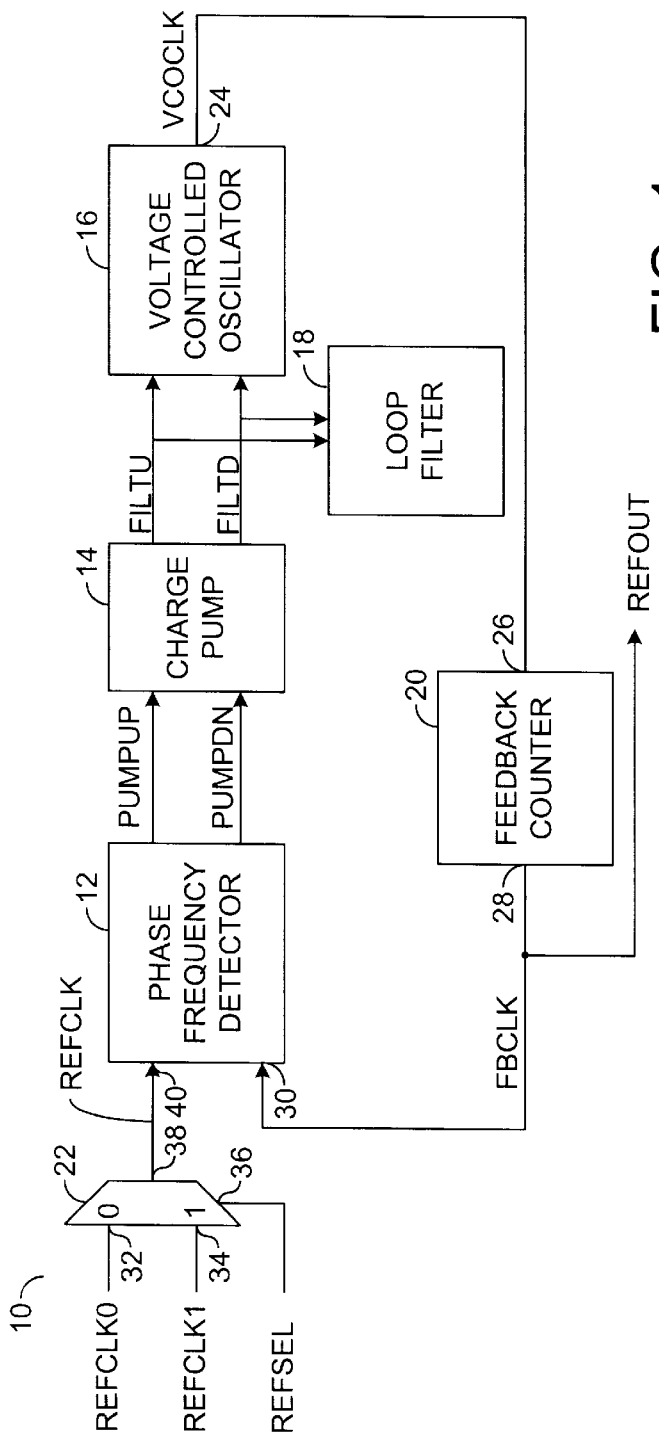
FIG. 1 is a block diagram of a conventional phase-locked loop.
Figure 2:
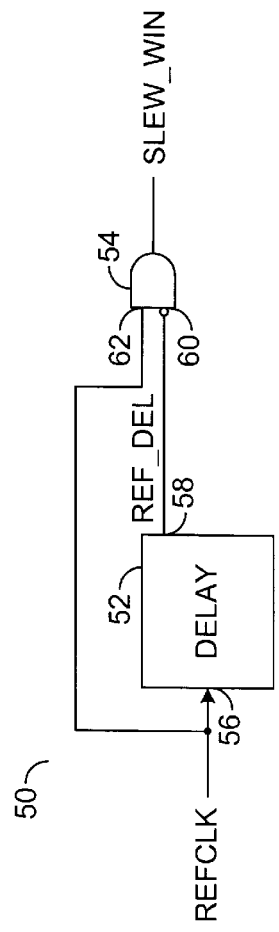
FIG. 2 is a block diagram of a slew rate reduction circuit.
Figure 3:
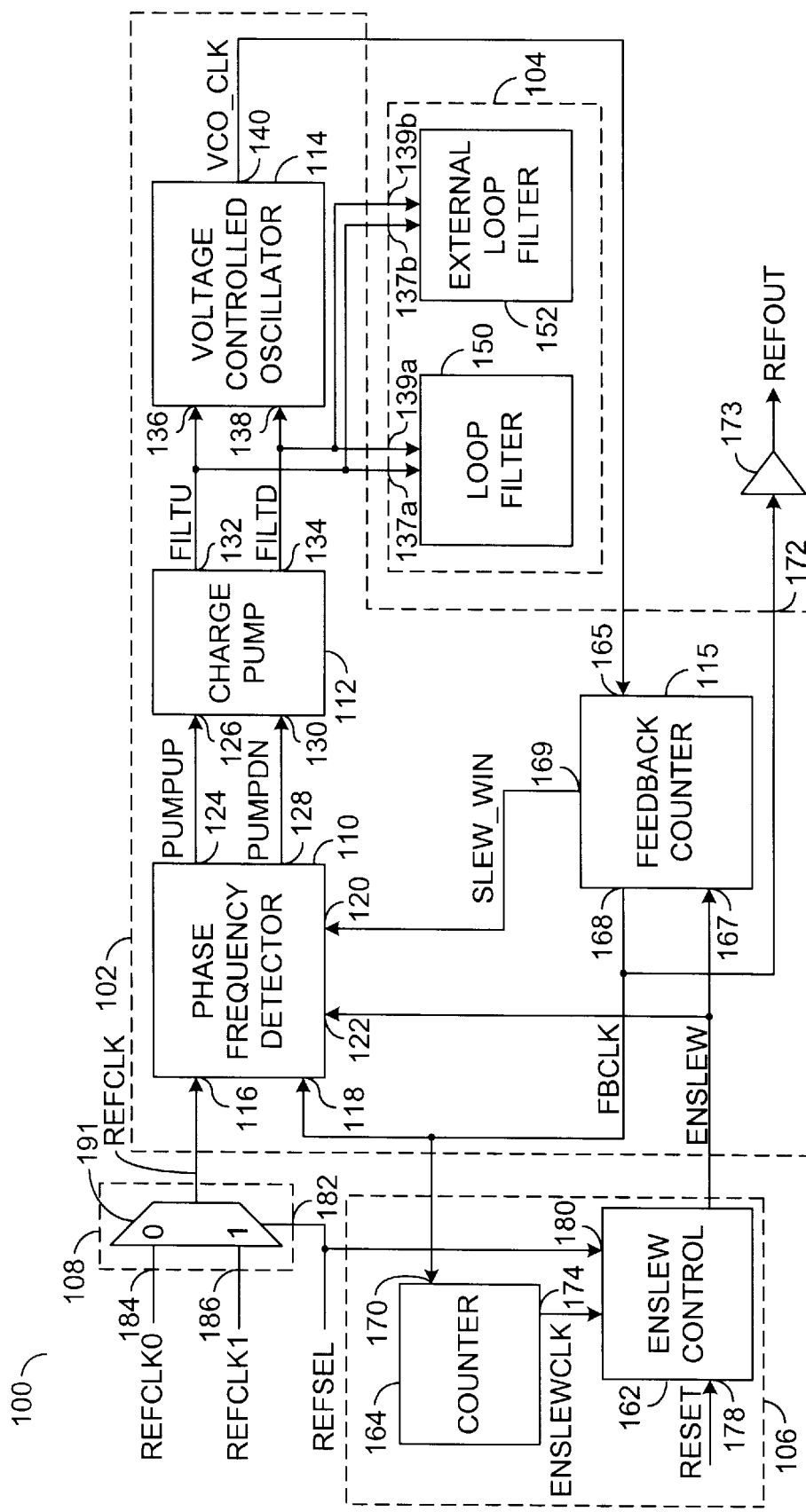
FIG. 3 is a block diagram of a preferred embodiment of the present invention.

Referring to FIG. 3, a circuit 100 is shown in accordance with a preferred embodiment of the present invention. The circuit 100 generally comprises a PLL block (or circuit) 102, a filter block (or circuit) 104, a slew control block (or circuit) 106 and a selection block (or circuit) 108. The PLL block 102 generally comprises a phase frequency detector 110, a charge pump 112, a voltage control oscillator 114 and a feedback counter 115. The PFD 110 has an input 116 that may receive a signal (e.g., REFCLK) from the selection block 108, an input 118 that may receive a signal (e.g., FBCLK) from the feedback counter 115, an input 120 that may receive a signal (e.g., SLEW_WIN) from the feedback counter 115 and an input 122 that may receive a control signal (e.g., ENSLEW) from the slew control circuit 106. The PFD 102 has an output 124 that may present a signal (e.g., PumpUp) to an input 126 of the charge pump 112 and an output 128 that may present a signal (e.g., PumpDn) to an input 130 of the charge pump 112. The charge pump 112 may present a filtered signal (e.g., FILTU) at an output 132 and a filtered signal (e.g., FILTD) at an output 134. The signal at the output 132 may be presented to an input 136 of the VCO 114 as well as to an input 137a and an input 137b of the filter block 104. The path between the inputs 137a and 137b and the output 132 may be a bi-directional path. Similarly, the path between the inputs 139a and 139b and the output 134 may be a bi-directional path. The VCO 114 has an output 140 that may present a signal (e.g., VCO_CLK).

The feedback counter 115 has an input 165 that may receive a signal (e.g., VCO_CLK) from the output 140 of the VCO 114. The feedback counter 115 may also have an input 167 that may receive the control signal (e.g., ENSLEW) from the slew control block 106. The feedback counter 115 may also have an output 168 that may present a signal (e.g., FBCLK) to the input 118 of the PFD 110, to an input 170 of the slew control block 106, and to an output 172. The signal presented at the output 172 may be presented as a buffered output through a buffer 173. The output 172 may represent a signal (e.g., REFOUT) oscillating at a reference frequency. The feedback counter 115 may also have an output 169 that may present a signal (e.g., SLEW_WIN) to the input 120 of the PFD 110.

The feedback counter 115 may generate the signal SLEW_WIN as a control window being a fixed percentage of the period of the signal FBCLK. In one example, the control window may be ⅛ of the period of the signal FBCLK. However, other control windows may be implemented accordingly to meet the design criteria of a particular application.

The PFD may limit the pulse generations of the signal PumpUp and PumpDn in response to the signal SLEW_WIN. The control window is generally derived synchronously, which may have a minimal amount of process/temperature/voltage variation. The synchronous generation of the control window may allow for a consistent operation of the circuit 200 under different conditions.

The filter section 104 generally comprises an internal loop filter 150 and an external loop filter 152. The loop filter 150 may provide a reduction in the slew rate by presenting a relatively small (e.g., 100 pf) capacitance between the charge pump 112 and the VCO 114. The external loop filter 152 may provide a larger capacitance (e.g., 1 $\mu$F) that may be in parallel with the loop filter 150. The size of each of the capacitances may be adjusted accordingly to meet the design criteria of a particular application. The external loop filter 152 may be deactivated by removing an external capacitor.

The slew control block 106 generally comprises an enabled slew control block (or circuit) 162, and a clock counter 164. The counter 164 may have an output 174 that may present a signal (e.g., ENSLEWCLK) to an input 176 of the enabled slew control block 162.

The enabled slew control block 162 may also comprise an input 178 that may receive an optional reset signal and may also have an input 180 that may receive a signal (e.g., REFSEL). The enabled slew control block 162 may store the current state of the signal REFSEL. When the signal REFSEL changes states, the signal ENSLEW may be set high for a predetermined time. The predetermined amount of time may be adjusted to meet the design criteria of a particular application. By de-asserting the signal ENSLEW, additional noise is not introduced into the circuit 100. The enabled slew control block 162 may also provide a glitch detector that may be configured to suppress noise on the signal REFSEL to avoid an inadvertent triggering of the signal ENSLEW.

The selection block 108 may also have an input 184 and an input 186 that may each receive reference clock signals (e.g., REFCLK0 and REFCLK1). The signal REFSEL may provide a switching signal to the selection block 108 that selects one of the reference clock signals. The selection block 108 may be implemented as a multiplexer 191. While two reference clock signals are shown for illustrative purposes, additional reference clock signals may be implemented accordingly to meet the design criteria of a particular application.

Figure 4:
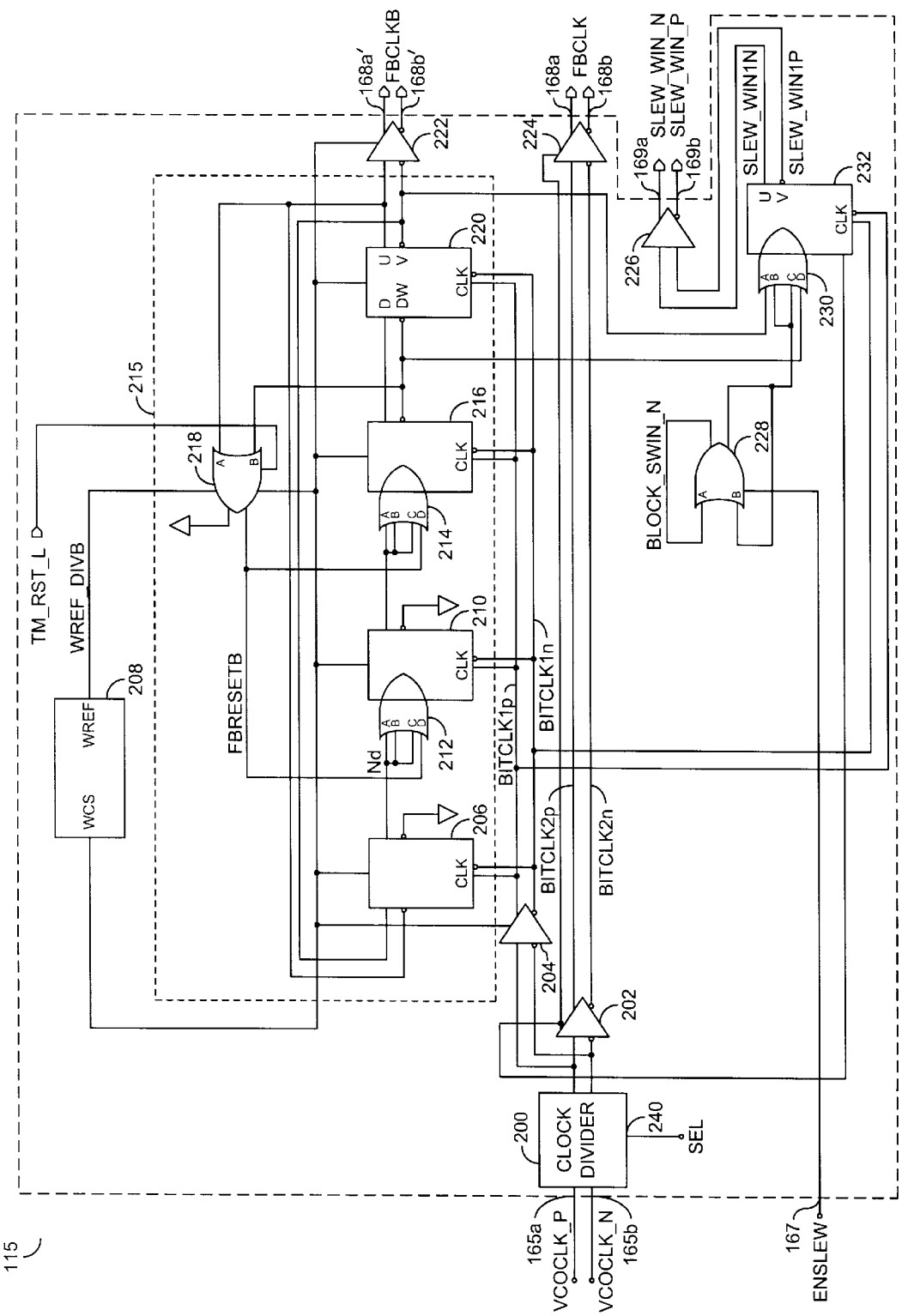
FIG. 4 is a more detailed circuit diagram of the feedback counter of the circuit of FIG. 3.

Referring to FIG. 4, a more detailed diagram of the feedback counter 115 is shown. The feedback counter 115 generally comprises an optional clock divider 200, a buffer 202, a buffer 204, a flip-flop 206, a voltage reference block 208, a flip-flop 210, a gate 212, a gate 214, a flip-flop 216, a gate 218, a flip-flop 220, a buffer 222, a buffer 224, a buffer 226, a gate 228, a gate 230 and a flip-flop 232. The flip-flops 206, 208, 210, 216, 220 and 232 may be, in one example, implemented as D-type flip-flops. The flip-flop 210 and the flip-flop 216 may combine the function of a flip-flop and a gate, with the addition of an additional transistor. The buffer 226 generally presents the signal SLEW_WIN at an output 169a and an output 169b. The buffer 224 generally presents the signal FBCLK at the outputs 168a and 168b. A complement of the signal FBCLK is generally presented at the outputs 168a' and 168b'. The clock divider circuit 200 generally receives the signal VCO_CLK and a select signal (e.g., SEL) and an input 240. The clock divider circuit 200 generally divides the clock VCO_CLK by one of a number of factors. In one example, the clock divider 200 may divide the signal VCO_CLK by a factor of 2 or by a factor of 6 based on the select signal SEL received at the input 240. The flip-flops 206, 210, 216, and 220 along with the gate 218 may be combined to implement an embedded divide by eight twisted ring counter 215.

Figure 5:
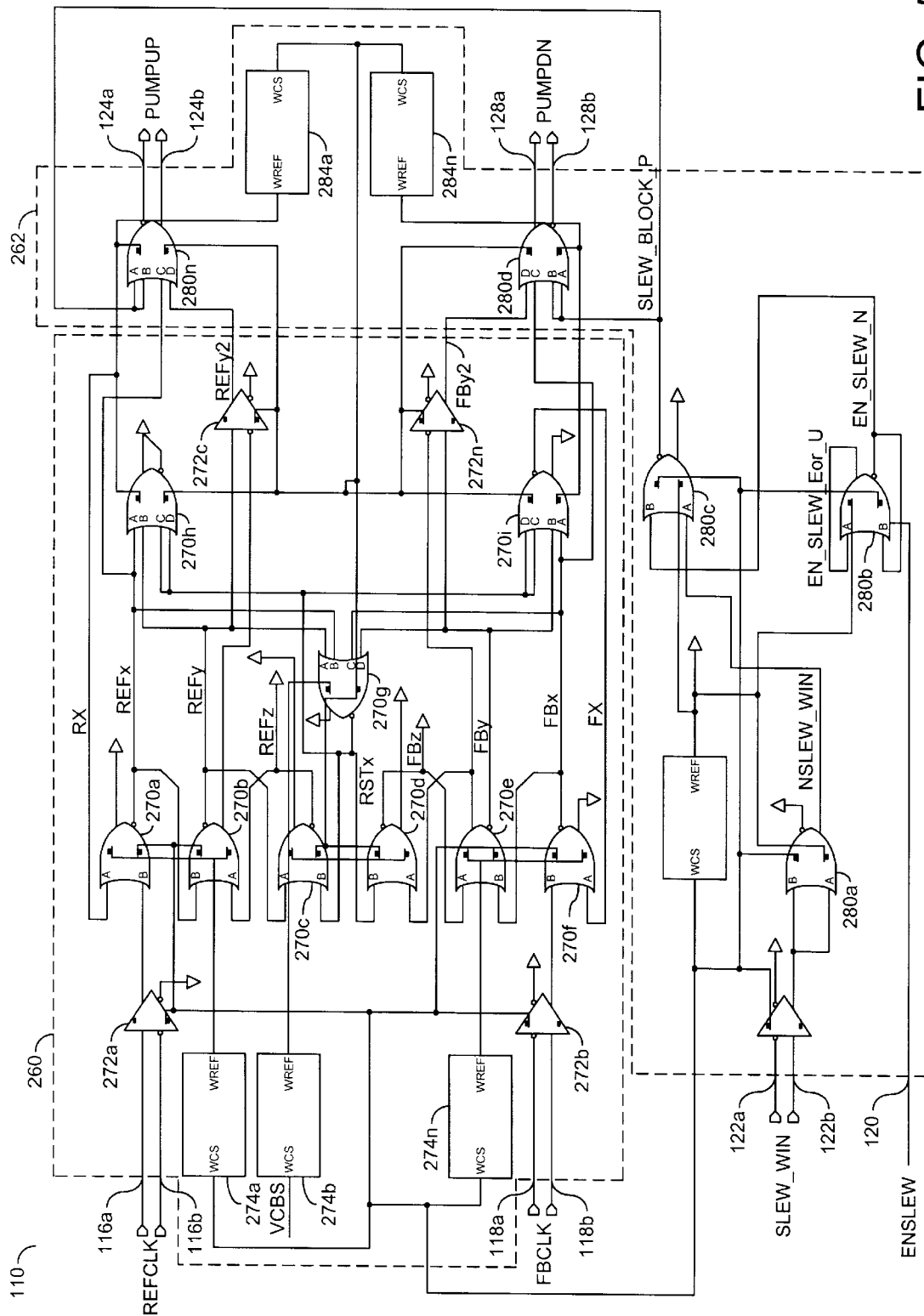
FIG. 5 is a more detailed circuit diagram of the phase frequency detector of the circuit of FIG. 3.

Referring to FIG. 5, a more detailed diagram of the phase frequency detector 110 is shown. The phase frequency detector 110 generally comprises a detection block (or circuit) 260 and a slew block (or circuit) 262. The detection block 260 generally receives the signal REFCLK and the signal FBCLK and may present the signal PumpUp and PumpDn, without slew compensation. The detection portion 260 generally comprises a number of gates 270a–270n, a number of inverters 272a–272n, and a number of devices 274a–274n. The slew control portion 262 generally comprises a number of gates 280a–280n, a buffer 282, and a number of devices 284a–284n. The slew circuit 262 receives the signal SLEW_WIN and the signal ENSLEW as well as information from the detector portion 260n and generally presents deskewed signals PumpUp and PumpDn.

Figure 6:
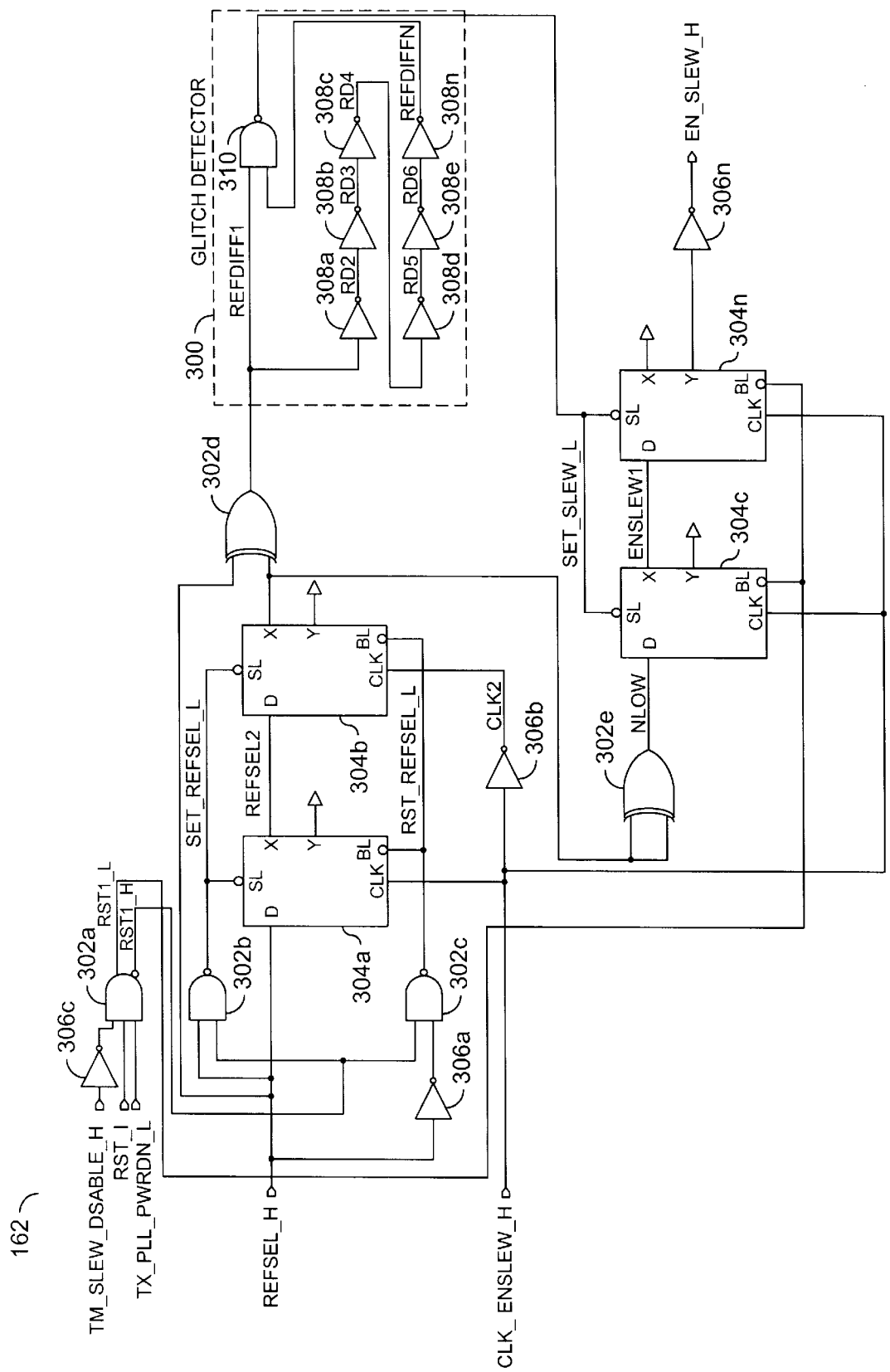
FIG. 6 is a circuit diagram illustrating the slew control circuit of the circuit of FIG. 3.

Referring to FIG. 6, a more detailed diagram of the slew control circuit 162 is shown. The slew control circuit 162 generally comprises a glitch detector 300, a number of gates 302a–302n and a number of flip-flops 304a–304n, and a number of buffers 306a–306n. The flip-flops 304a–304n may be implemented, in one example, as D-type flip-flops. The glitch detector 300 generally comprises a number of inverters 308a–308n and a gate 310. The glitch detector 300 generally suppresses the activation of the signal EN_SLEW in the event of a momentary glitch of the signal REFSEL. This glitch suppression generally ensures that additional noise is not inserted into the circuit 100.

Figure 7:
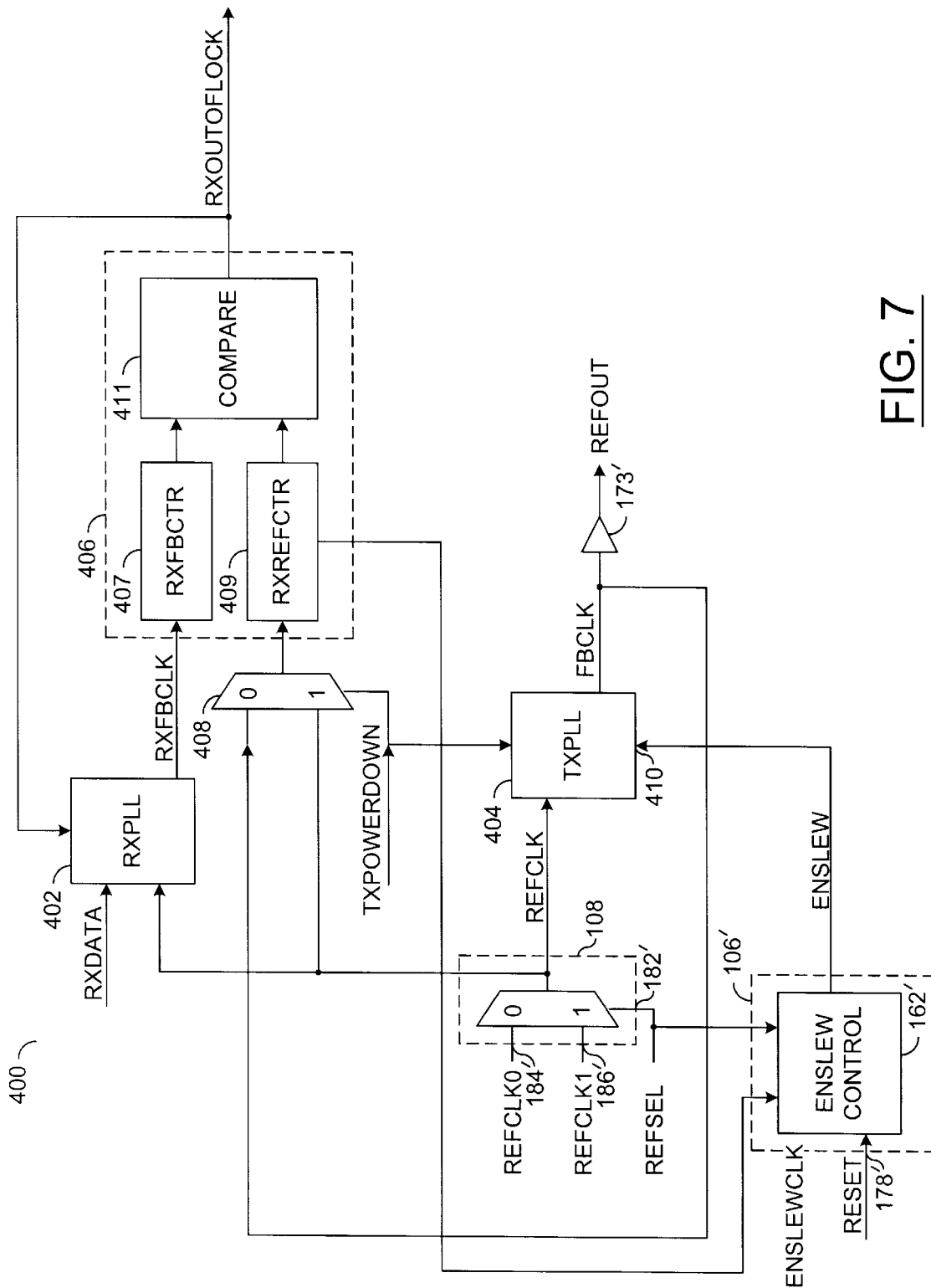
FIG. 7 is a block diagram of one implementation of the present invention.

Referring to FIG. 7, a circuit 400 is shown illustrating an alternate embodiment of the present invention. The circuit 400 generally comprises a slew control circuit 106' and a selector circuit 108' that may be similar to the slew control 106 and selector 108 of FIG. 3. The circuit 400 further comprises a receive PLL 402, a transmit PLL 404, a range control block (or circuit) 406, and a multiplexer 408. The transmit PLL 404 typically comprises the block 102 and the block 104 of FIG. 3. The control block 406 generally comprises a feedback counter (e.g., RxFbCTR) 407, a reference counter (e.g., RvRefCtr) 409, and a compare block (or circuit) 411. The transmit PLL 404 may receive a signal (e.g., ENSLEW) at an input 410 that may provide slew rate control similar to the embodiment described in connection with FIG. 3.

Figure 8:
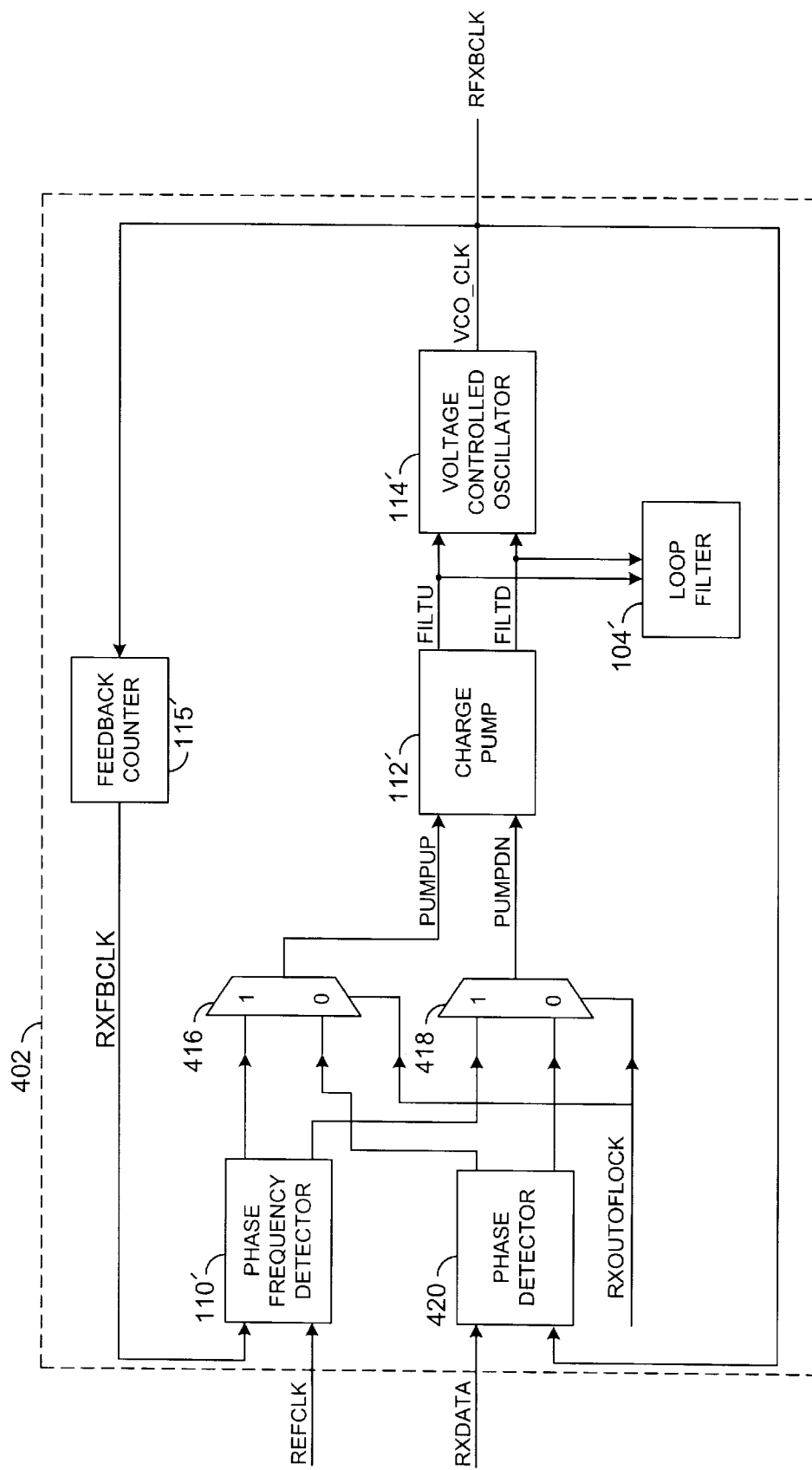
FIG. 8 is a more detailed diagram of the receive PLL of FIG. 7.

Referring to FIG. 8, a more detailed diagram of the receive PLL 402 is shown. The receive PLL 402 generally comprises a phase frequency detector block 110', a feedback counter 115', a charge pump 112', a voltage controlled oscillator 114', a loop filter 104', a multiplexer 416 and a multiplexer 418. An additional phase detector 420 may be provided to select between the reference clock REFCLK and the receive data RXDATA. The counter 164 in FIG. 3 may be replaced by the reference counter to minimize die area. FIGS. 7 and 8 illustrate the present invention in a typical implementation.

While the invention has been particularly shown and described with reference to the preferred embodiments thereof, it will be understood by those skilled in the art that various changes in form and details may be made without departing from the spirit and scope of the invention.

We claim:

1. An apparatus comprising:
    a phase-locked loop configured to generate an output signal in response to (i) a reference clock, (ii) a first control signal and (iii) a second control signal;
    a feedback counter circuit configured to generate said first and second control signals in response to (i) said output signal and (ii) a third control signal;
    a select circuit configured to present said reference clock signal in response to (i) a plurality of input clock signals and (ii) a select signal; and
    a control circuit configured to generate said third control signal in response to (i) said select signal, and (ii) said first control signal.

2. The apparatus according to claim 1, wherein said second control signal comprises a control window signal.

3. The apparatus according to claim 1, further comprising a buffer configured to present a second output signal in response to said first control signal.

4. The apparatus according to claim 1, wherein said select circuit comprises a multiplexer configured to present said reference clock in response to said select signal.

5. The apparatus according to claim 1, further comprising:
    an internal loop filter configured to control a slew rate of said output signal; and
    an external loop filter configured to control the slew rate of said output signal, wherein said external loop filter may be disabled.

6. The apparatus according to claim 1, wherein said control circuit generates said third control signal in response to a transition of said select signal.

7. The apparatus according to claim 6, wherein said third control signal is asserted for a predetermined time after said transition of said select signal.

8. An apparatus comprising:
    a first phase-locked loop configured to generate a first output signal in response to (i) a reference clock, (ii) a data input signal and (iii) a lock signal;
    a select circuit configured to present said reference clock signal in response to (i) a plurality of input clock signals and (ii) a select signal;
    a control circuit configured to generate a control signal in response to (i) said select signal, and (ii) a feedback signal;
    a second phase-locked loop configured to generate second output signal in response to (i) said reference clock and (ii) said control signal; and
    a range control circuit configured to generate said lock signal and said feedback signal in response to said first output signal and a reference signal.

9. The apparatus according to claim 8, wherein said first phase-locked loop comprises a data clock recovery phase-locked loop and a second phase-locked loop comprises a frequency synthesis phase-locked loop.

10. The apparatus according to claim 8, wherein said reference signal is generated by multiplexing said reference clock and said second output.

11. The apparatus according to claim 8, wherein said lock signal comprises a out of lock signal.

12. A method for reducing the slew rate of a periodic signal generating circuit comprising the steps of:
    generating a reference clock signal in response to one or more input signals, and a select signal, wherein the select signal transitions between one or more states;
    detecting a transition on said select signal;
    asserting a first control signal for a predetermined time after the detection of said transition on said select signal;
    generating (i) a control window signal and (ii) a second control signal in response to said first control signal and said periodic signal;
    enabling a slew minimization circuit when said control window signal is asserted; and
    generating said periodic signal in response to (i) said reference signal, (ii) said control, (ii) said control window signal and (iii) said second control signal.

13. The method according to claim 12, wherein said control window is synchronously generated in response to said periodic signal.

14. The method according to claim 12, wherein said control window is a percentage of a period of said periodic signal.

15. The method according to claim 12, further comprising the step of:
    prior to said step of asserting said control signal, filtering said transition on said select signal.

16. An apparatus comprising:
    a phase-locked loop configured to generate an output signal in response to (i) a reference clock and (ii) a control signal;
    an internal loop filter configured to control a slew rate of said output signal;
    an external loop filter configured to control the slew rate of said output signal, wherein said external loop filter may be disabled;
    a select circuit configured to present said reference clock signal in response to (i) a plurality of input clock signals and (ii) a select signal; and
    a control circuit configured to generate said control signal in response to (i) said select signal, and (ii) said output signal.

17. The apparatus according to claim 1, wherein said phase-locked loop is configured to generate said output signal in further response to said second control signal.

18. The method according to claim 12, wherein said periodic signal is generated in further response to said first control signal.

19. The method according to claim 12, further comprising the step of:
    buffering said periodic signal to generate an output periodic signal.

* * * * *